(12) United States Patent  (10) Patent No.: US 6,934,203 B2
Choi  (45) Date of Patent: Aug. 23, 2005

(54) SEMICONDUCTOR MEMORY DEVICE FOR IMPROVING REDUNDANCY EFFICIENCY

(75) Inventor: Sung-ho Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/735,947

(22) Filed: Dec. 15, 2003

(65) Prior Publication Data

US 2004/0228182 A1 Nov. 18, 2004

(30) Foreign Application Priority Data

May 12, 2003 (KR) ................................ 10-2003-0029759

(51) Int. Cl.$^7$ .............................................. G11C 29/00
(52) U.S. Cl. ...................... 365/200; 365/201; 365/225.7
(58) Field of Search ................................ 365/200, 201, 365/225.7

(56) References Cited

U.S. PATENT DOCUMENTS 4,768,193 A * 8/1988 Takemae .................... 714/711
6,418,068 B1 * 7/2002 Raynham .................... 365/200

FOREIGN PATENT DOCUMENTS

| JP | 11-250695 | 9/1999 | ........... G11C/29/00 |
| JP | 2002-042488 | 2/2002 | ........... G11C/29/00 |

* cited by examiner

Primary Examiner—Anh Phung
Assistant Examiner—Pho M. Luu
(74) Attorney, Agent, or Firm—F. Chau & Associates LLC

(57) ABSTRACT

A semiconductor memory device including a plurality of normal cell blocks including a plurality of normal memory cells for storing data, a plurality of redundancy cell blocks, a plurality of redundancy memory cells for substituting for defective normal memory cells, and at least one ECC cell block including a plurality of ECC memory cells, for substituting for defective normal memory cells in response to a mode signal.

24 Claims, 6 Drawing Sheets

SEMICONDUCTOR MEMORY DEVICE FOR IMPROVING REDUNDANCY EFFICIENCY

BACKGROUND OF THE INVENTION

1. Technical Field

The present disclosure relates to a semiconductor memory device, and more particularly, to a method of improving redundancy efficiency in a semiconductor memory device.

2. Discussion of the Related Art

The manufacture of different types of semiconductor memory chips has been combined in order to reduce development and mass production costs. For example, both a memory chip using memory cells for storing error checking/correcting codes (ECCs) and a memory chip not using ECC memory cells have been simultaneously manufactured. As a result, labor and expenses can be reduced as compared to cases where the chips are individually formed.

When a first memory chip using ECC cells and a second memory chip not using ECC cells are simultaneously formed, the ECC cells in the second memory chip are dummy cells because, although they occupy an area of the second memory chip, they are not used.

FIG. 1 is a schematic block diagram of a conventional semiconductor memory device 100. Referring to FIG. 1, the semiconductor memory device 100 includes a plurality of memory banks. FIG. 1 illustrates the semiconductor memory device 100 including four memory banks 110, 120, 130, and 140. Each of the memory banks 110, 120, 130, and 140 include a NOR cell block NOR, and an ECC cell block ECC.

The NOR cell block NOR may include memory cells, in which data (e.g., other than ECC data) is stored, and redundancy memory cells which substitute for defective memory cells. The ECC cell block ECC includes ECC memory cells in which ECC data (e.g., error checking/correcting codes) is stored.

FIG. 2 is a block diagram of one memory bank 110 of the semiconductor memory device in FIG. 1. Referring to FIG. 2, the memory bank 110 includes a plurality of normal or first level cell blocks B1 through B5, a plurality of redundancy cell blocks RD1 through RD5, and an ECC cell block ECC. The modifier "normal" for purposes of this disclosure is being used to distinguish between first level cell blocks, memory cells and components associated therewith and remaining cell blocks, memory cells and components associated therewith. For example, redundancy cell blocks and memory cells can substitute for "normal" cell blocks and memory cells that become defective. The NOR cell block NOR of FIG. 1 includes a plurality of the normal cell blocks B1 through B5, and the plurality of redundancy cell blocks RD1 through RD5.

The normal cell blocks B1 through B5 include memory cells for storing data (referred to as normal memory cells hereinafter). The redundancy cell blocks RD1 through RD5 include redundancy memory cells which substitute for defective normal memory cells, such that when a defect occurs in the normal cell blocks B1 through B5, the redundancy cells in the redundancy cell blocks RD1 through RD5 act substitute for the defective normal memory cells. For example, as shown in FIG. 2, defective memory cells F1, F2, F3, F4 and F5 of the normal cell blocks B1, B2, B3, B4 and B5, respectively may be replaced by redundancy cells R1, R2, R3, R4 and R5 of the redundancy cell blocks RD1, RD2, RD3, RD4 and RD5, respectively.

When the semiconductor memory device 100 shown in FIG. 1 does not use any memory cells for storing ECCs, the ECC cell block ECC becomes a dummy cell block and occupies an area in the semiconductor memory device without performing a specific function. Therefore, there exists a need to utilize the unused ECC cells.

SUMMARY OF THE INVENTION

A semiconductor memory device, according to an embodiment of the present invention, includes a plurality of normal cell blocks including a plurality of normal memory cells for storing data, a plurality of redundancy cell blocks including a plurality of redundancy memory cells for substituting for defective normal memory cells, and at least one ECC cell block including a plurality of ECC memory cells for substituting for the defective normal memory cells in response to a mode signal.

The plurality of ECC memory cells may be used for substituting for the defective normal memory cells after each of the plurality of redundancy memory cells has been used for substituting for the defective normal memory cells. The mode signal may be generated when a bonding option occurs or when a predetermined fuse is cut.

The semiconductor memory device may further include a plurality of normal lines for at least one of inputting and outputting the data to and from the plurality of normal memory cells, a plurality of ECC data lines for at least one of inputting and outputting the data to and from the plurality of ECC memory cells, and at least one repair circuit for severing a connection between at least one normal data line of the plurality of normal lines and at least one normal cell block of the plurality of normal cell blocks in response to the mode signal and for connecting the normal data lines to at least one ECC data line of the plurality of ECC data lines.

The at least one repair circuit may include at least one normal switching unit for controlling the connection between the at least one normal data line and the at least one normal cell block, and at least one ECC switching unit for controlling the connection between the at least one normal data line and the at least one ECC data line. The at least one normal switching unit and the at least one ECC switching unit may be respectively turned on or off in response to control signals, wherein the control signals are generated when a predetermined fuse is cut or when a bonding option occurs.

The semiconductor memory device may further include a plurality of normal bit lines connected to the plurality of normal memory cells, a plurality of normal data lines for at least one of inputting and outputting the data to and from the plurality of normal memory cells, a plurality of normal transmission gates for connecting the plurality of normal bit lines to the plurality of normal data lines in response to a first column select line signal, a plurality of ECC bit lines connected to the plurality of ECC memory cells; a plurality of ECC data lines for at least one of inputting and outputting the data to and from the plurality of ECC memory cells, a plurality of ECC transmission gates for connecting the plurality of ECC bit lines to the plurality of ECC data lines in response to a second column select line signal, and at least one repair circuit for enabling the second column select line signal in response to the mode signal.

The at least one repair circuit may include a plurality of switching units for connecting the plurality the normal data lines to the plurality of ECC data lines in response to the mode signal. The plurality of switching units may be turned on or off in response to control signals. The mode signal may represent a bit configuration indicating a number of data bits one of input to and output from the semiconductor memory device.

Another semiconductor device, according to an embodiment of the present invention, includes a plurality of normal cell blocks including a plurality of normal memory cells for storing data, at least one ECC cell block including a first plurality of ECC memory cells for storing ECC data, at least one other ECC cell block including a second plurality of ECC memory cells, wherein the second plurality of ECC memory cells is not used for storing ECC data, and at least one repair circuit for controlling the at least one ECC cell block and the first plurality of ECC memory cells, whereby the first plurality of ECC memory cells are used for substituting for defective normal memory cells in response to a mode signal, and are not used for storing ECC data.

The semiconductor memory device may further include a plurality of normal bit lines connected to the plurality of normal memory cells, a plurality of normal data lines for at least one of inputting and outputting the data to and from the plurality of normal memory cells, a plurality of normal gates for connecting the plurality of normal bit lines to the plurality of normal data lines in response to a first column select line signal, a plurality of ECC bit lines connected to the first and the second plurality of ECC memory cells, a plurality of ECC data lines for at least one inputting and outputting the data to and from the first and the second plurality of ECC memory cells, and a plurality of ECC gates for connecting the plurality of ECC bit lines to the plurality of ECC data lines in response to a second column select line signal.

Another semiconductor memory device, according to an embodiment of the present invention, includes at least one first level cell block including a plurality of first level memory cells for storing data, at least one second level cell block including a plurality of second level memory cells for substituting for defective first level memory cells, and at least one third level cell block including a plurality of third level memory cells for substituting for the defective first level memory cells in response to a mode signal.

The plurality of third level memory cells may be used for substituting for the defective first level memory cells when the plurality of second level memory cells are not available for substituting for the defective first level memory cells. The semiconductor device may further include at least one data line for carrying the data at least one of to and from the plurality of first level memory cells, at least one other data line for carrying the data at least one of to and from the plurality of third level memory cells, and at least one repair circuit for severing a connection between the at least one data line and at least one first level memory cell of the plurality of first level memory cells, and for connecting the at least one data line to the at least one other data line.

The semiconductor memory device may also include at least one bit line connected to the plurality of first level memory cells, at least one transmission gate for connecting the at least one bit line to the at least one data line in response to a first column select line signal, at least one other bit line connected to the plurality of third level memory cells, at least one other transmission gate for connecting the at least one other bit line to the at least one other data line in response to a second column select line signal, and at least one repair circuit for enabling the second column select line signal in response to the mode signal.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will now be described more fully hereinafter below with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
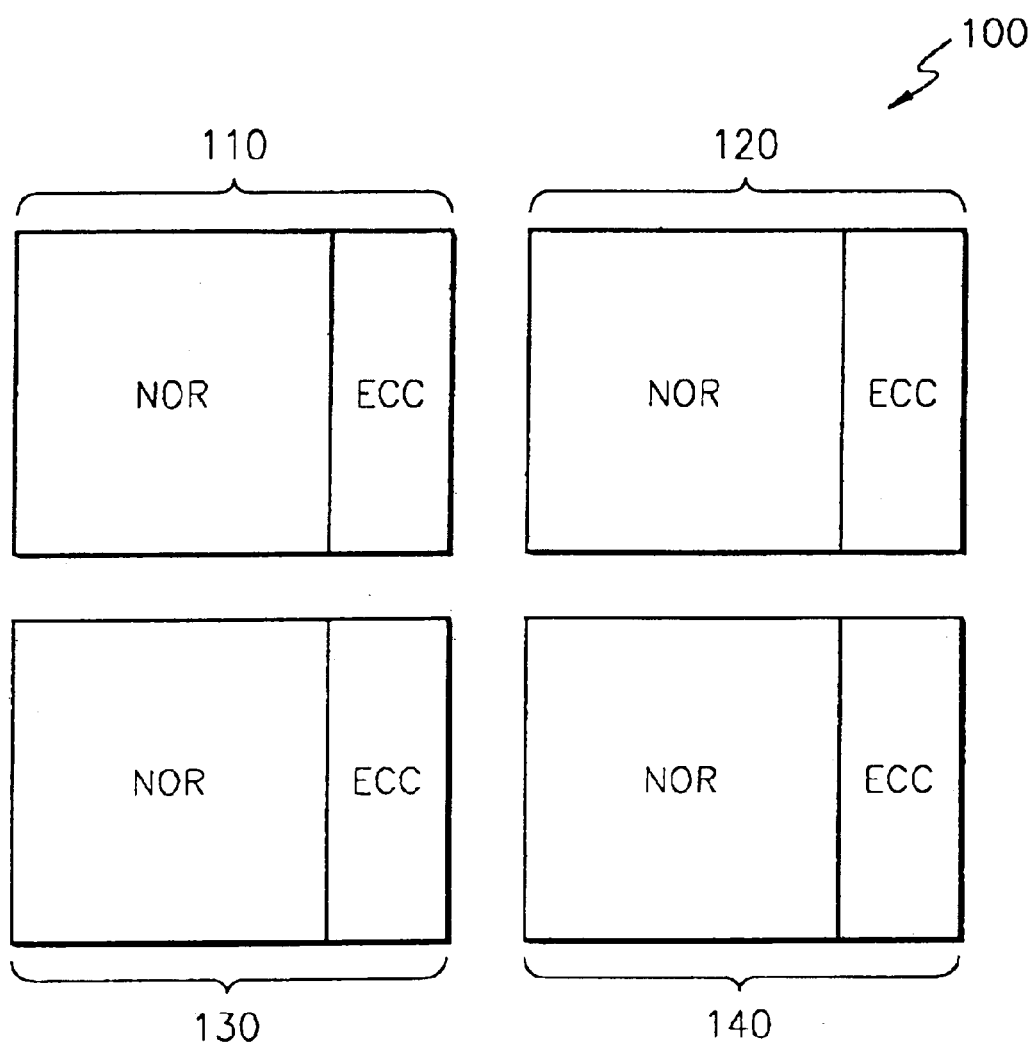
FIG. 1 is a schematic block diagram of a conventional semiconductor memory device.
Figure 2:
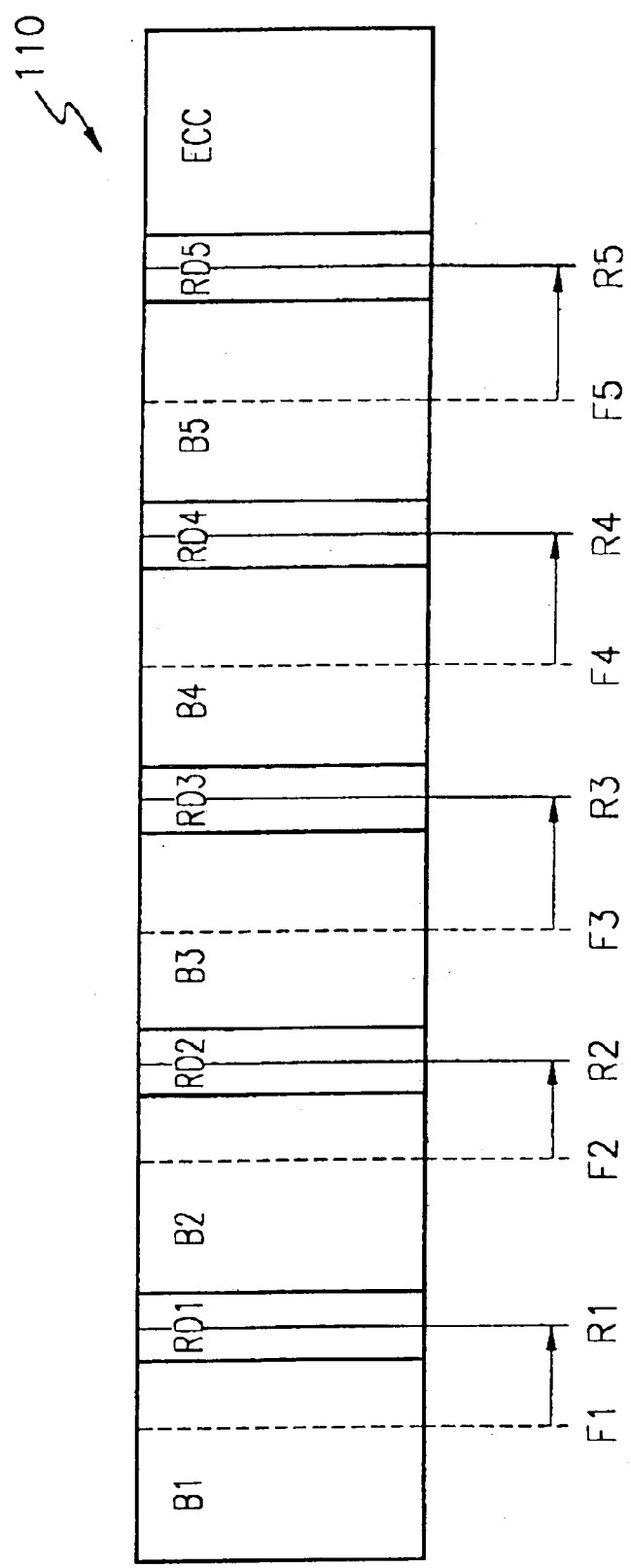
FIG. 2 is a schematic block diagram of a memory bank of the semiconductor memory device in FIG. 1.
Figure 3:
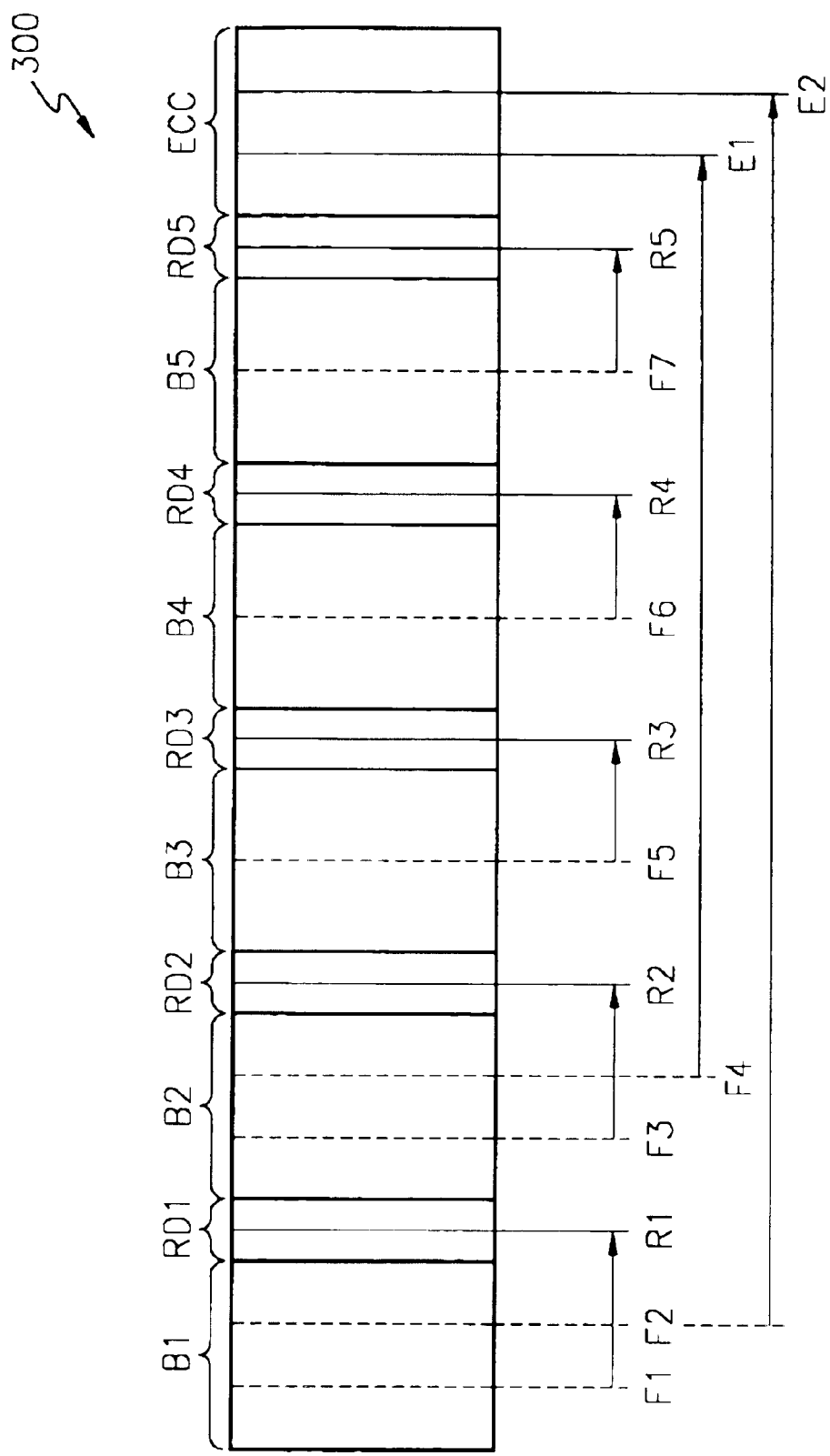
FIG. 3 is schematic block diagram of a semiconductor memory device according to an embodiment of the present invention.

FIG. 3 is a schematic block diagram of a semiconductor memory device according to an embodiment of the present invention. According to an embodiment of the present invention, a memory device, for example, a memory chip, is combined with a memory device or chip which includes error checking/correcting code (ECC) cell blocks. In other words, the memory device is combined with a semiconductor chip including ECC cell blocks. According to an embodiment of the present invention, the ECC cell blocks are used as redundancy cell blocks, not for storing ECC data. The ECC data may include error checking codes, error correcting codes and/or parity bits. The semiconductor memory device 300 illustrated in FIG. 3 includes one or more memory banks, wherein each memory bank includes normal cell blocks B1 through B5, redundancy cell blocks RD1 through RD5, and an ECC cell block ECC.

The normal cell blocks B1 through B5 respectively include normal memory cells in which data is stored. The redundancy cell blocks RD1 through RD5 include redundancy memory cells which substitute for defective normal memory cells in the normal cell blocks. The ECC cell block ECC includes ECC memory cells in which ECC data is can be stored. However, according to an embodiment of the present invention, the ECC memory cells are not used to store ECC data but, instead, are used to substitute for defective memory cells.

In accordance with an embodiment of the present invention, a mode signal represents a bit configuration that, for example, indicates the number of data bits input or output in a parallel manner to or from the semiconductor device. For example, a mode signal may be a "x16" signal. The x16 signal represents the number of data bits simultaneously input or output to or from the semiconductor device, namely, 16 bits. When the number of data bits simultaneously input/output is 16 bits, two ECC data bits may also be input/output in addition to the 16 bits. As a result, a total of 18 bits including the ECC data are simultaneously input/ output. In other words, the semiconductor device operates at "x18". When the semiconductor memory device capable of operating at x18 operates at x16, ECC cell blocks are not being used. Therefore, according to an embodiment of the present invention, the ECC cell blocks are diverted to be used as redundancy cell blocks in response to a signal representing a bit configuration, for example, a x16 signal. Thus, according to an embodiment of the present invention, the semiconductor memory device 300 further includes repair circuits which control the ECC cell block ECC to substitute ECC memory cells for defective memory cells in response to the mode signal.

When there are more defective memory cells than those that can be replaced by the redundancy memory cells of the redundancy cell blocks RD1 through RD5, the ECC cell block ECC may be used as the redundancy cell block, such that the rest of the defective memory cells are replaced by ECC cells.

For example, as shown in FIG. 3, when a plurality of defective memory cells F1 through F7 are generated, some of the defective memory cells F1, F3, F5, F6 and F7 are replaced by redundancy cells R1 through R5, and the remaining defective memory cells F2 and F4 are replaced with ECC cells E1 and E2.

More specifically, the defective memory cells F1, F3, F5, F6 and F7 of the normal cell blocks B1, B2, B3, B4 and B5, respectively are replaced by the redundancy cells R1, R2, R3, R4 and R5 of the redundancy cell blocks RD1, RD2, RD3, RD4 and RD5, respectively. The defective memory cell F2 of the normal cell block B1 and the defective memory cell F4 of the normal cell block B2, which cannot be replaced by the redundancy cells of the redundancy cell blocks RD1 through RD5, are replaced by the ECC cells E1 and E2, respectively of the ECC cell block ECC. Alternatively, although redundancy cells of the redundancy cell blocks RD1 through RD5 may be available to substitute for defective memory cells, in some instances, the ECC cells may be used before the redundancy cells to repair the defective memory cells.

Figure 4:
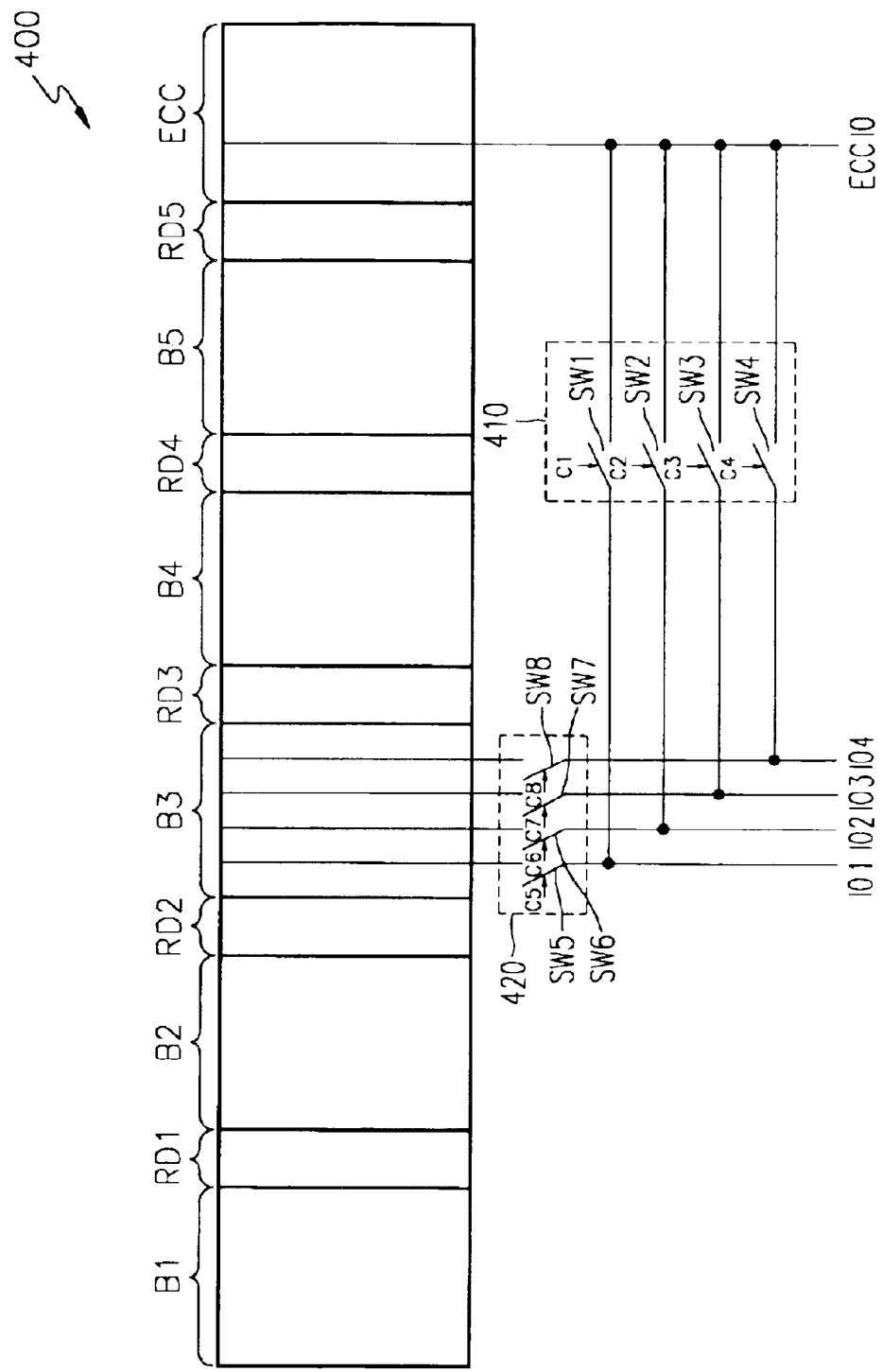
FIG. 4 is a schematic block diagram of a semiconductor memory device according to a an embodiment of the present invention.

FIG. 4 is a schematic block diagram of a semiconductor memory device 400 according a an embodiment of the present invention. Referring to FIG. 4, the semiconductor memory device 400 includes normal cell blocks B1 through B5, redundancy cell blocks RD1 through RD5, an ECC cell block ECC, normal input/output lines IO1 through IO4 (i.e., input/output lines for inputting and outputting data to and from normal cell blocks), an ECC input/output line ECC IO (i.e., an input/output line for inputting and outputting data to and from an ECC cell block), and repair circuits 410 and 420.

The normal cell blocks B1 through B5, the redundancy cell blocks RD1 through RD5, and the ECC cell block ECC are the same as or similar to those described in FIG. 3, and accordingly, a detailed explanation thereof will be omitted.

The normal input/output lines IO1 through IO4 input and output data to and from the normal cell blocks B1 through B5. The ECC input/output line ECC IO inputs and outputs data to and from the ECC cell block ECC. Data stored in the normal memory cells may be input and output to and from the memory device through bit lines (not shown) and through the normal input/output lines IO1 through IO4. Data stored in an ECC cell may be input and output to and from the memory device through bit lines (not shown) and through the ECC input/output line ECC IO. FIG. 4 illustrates four normal input/output lines IO1 through IO4 and one ECC input/output line ECC IO, but the total number of input/output lines may vary.

The repair circuits 410 and 420 control the ECC memory cells of the ECC cell block ECC so that the ECC memory cells substitute for defective memory cells in response to a mode signal. Specifically, the repair circuits 410 and 420 include ECC switches SW1 through SW4, and normal switches SW5 through SW8, respectively. As shown in FIG. 4, the normal switches SW5 through SW8 control connections between the normal memory cells of at least one of the normal cell blocks B1 through B5 (e.g., cell block B3) and the normal input/output lines IO1 through IO4, respectively. The ECC switches SW1 through SW4 control connections between the normal input/output lines IO1 through IO4, respectively, and the ECC input/output line ECC IO. The ECC input/output line ECC IO is connected to the memory cells of the ECC cell block ECC.

In operation, the ECC switches SW1 through SW4 are in a default off state and the normal switches SW5 through SW8 are in a default on state. However, when one or more cells among the normal memory cells are defective, the switches SW1 through SW4 may be switched on and corresponding switches SW5 through SW8 may be switched off. For example, if one or more cells connected to the normal input/output line IO1 are defective, the normal switch SW5 is turned off to sever the connection between the defective memory cells and the normal input/output line IO1, and the ECC switch SW1 is turned on to connect the normal input/output line IO1 to the ECC input/output line ECC IO. As a result, data is no longer stored in the normal memory cell, which has been disconnected from the normal input/output line IO1. Instead, data is stored in the ECC memory cell which is connected to the normal input/output line IO1 and the ECC input/output line ECC IO. Therefore, the semiconductor memory device in FIG. 4 is capable of repairing the defective memory cells via the switches and input/output lines. With the configuration shown in FIG. 4, when any one of the normal memory cells connected to one normal input/output line is defective, all of the normal memory cells connected to the one normal input/output line may be replaced by the ECC cells of the ECC cell block ECC.

The ECC switches SW1 through SW4 and the normal switches SW5 through SW8 are respectively controlled by control signals C1 through C8. The control signals C1 through C8 may be generated when the mode signal is in a predetermined state, for example, when the mode signal is x16. The mode signal may be generated when a fuse (not shown), which can control the generation of the mode signal, is cut. The mode signal also may be generated in response to whether or not a bonding option occurs. As known to those of ordinary skill in the art, the state of the mode signal can be determined in response to whether or not a bonding pad relating to the mode signal is wire-bonded to a power source. The fuse or bonding option technology can also be used to generate the control signals C1 through C8. For example, when the fuse technology is used, a plurality of fuses corresponding to the control signals C1 through C8 may be provided and the control signals C1 through C8 are generated according to whether or not the corresponding fuses are cut.

Figure 5:
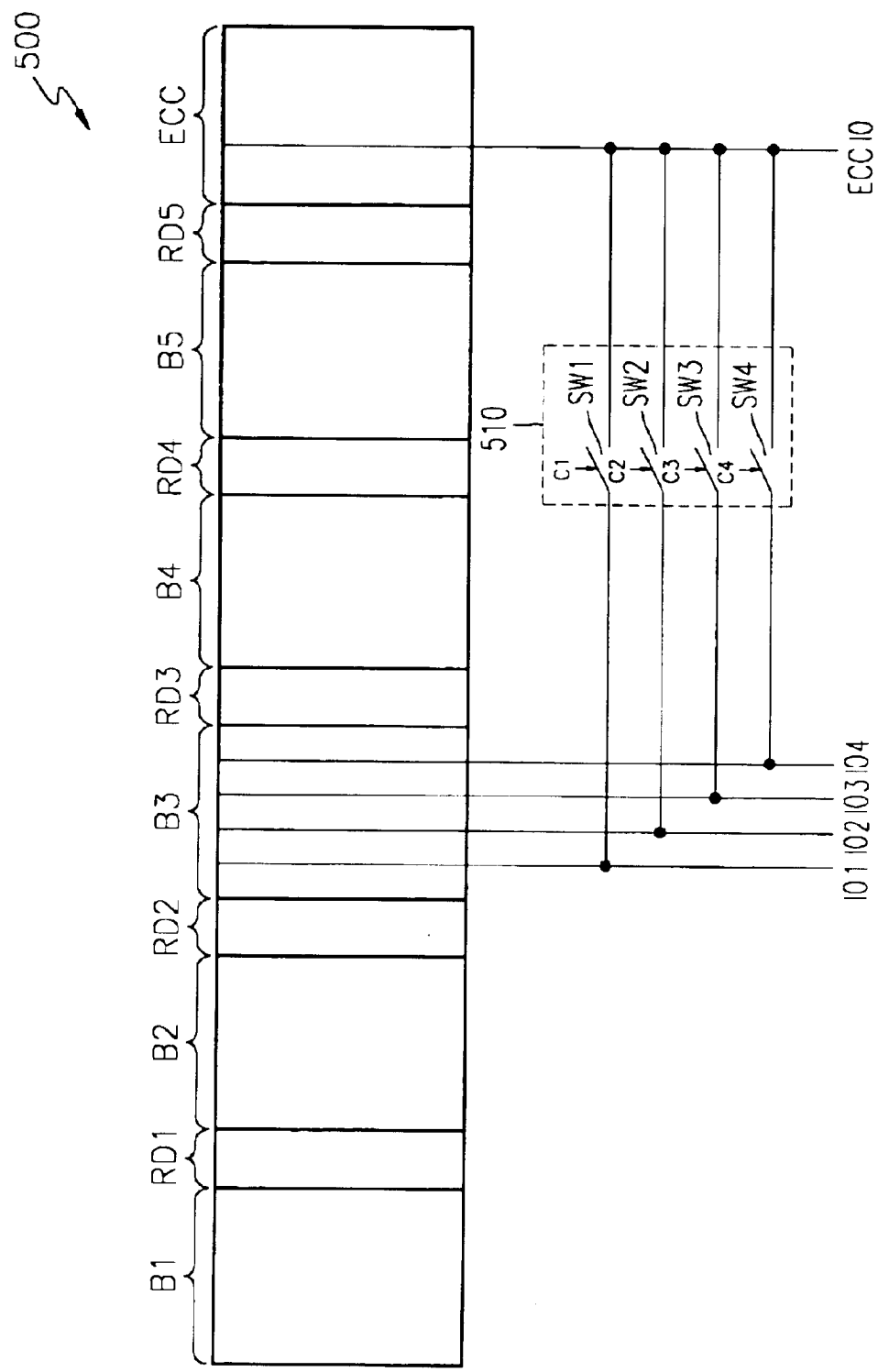
FIG. 5 is a schematic block diagram of a semiconductor memory device according to an embodiment of the present invention.

FIG. 5 is a schematic block diagram of a semiconductor memory device 500 according to an embodiment of the present invention. Referring to FIG. 5, the semiconductor memory device 500 includes normal cell blocks B1 through B5, redundancy cell blocks RD1 through RD5, an ECC cell block ECC, normal input/output lines IO1 through IO4, an ECC input/output line ECC IO, and an input/output control circuit 510.

The normal cell blocks B1 through B5, the redundancy cell blocks RD1 through RD5, the ECC cell block, the normal input/output lines IO1 through IO4, and the ECC input/output line ECC IO are the same as or similar to those described in FIG. 4, and accordingly, a detailed explanation thereof will be omitted. The input/output control circuit 510, also referred to as the repair circuit 510, controls the substitution of ECC memory cells of the ECC cell block ECC for defective memory cells in response to a mode signal. The repair circuit 510 includes ECC switches SW1 through SW4. The ECC switches SW1 through SW4 are respectively controlled by control signals C1 through C4.

The ECC switches SW1 through SW4 control connections between the normal input/output lines IO1 through IO4 and the ECC input/output line ECC IO. In operation, the ECC switches SW1 through SW4 are in a default off state. When one or more of the normal memory cells connected to the normal input/output line IO1 become defective, the switches SW1 through SW4 may be switched on. For example, the ECC switch SW1 may be turned on to connect the normal input/output line IO1 to the ECC input/output line ECC IO.

Like the fuse and bonding option described in connection with FIG. 4, the mode signal and the control signals C1 through C4 may be generated when a fuse (not shown) is cut, or a bonding option occurs.

Figure 6:
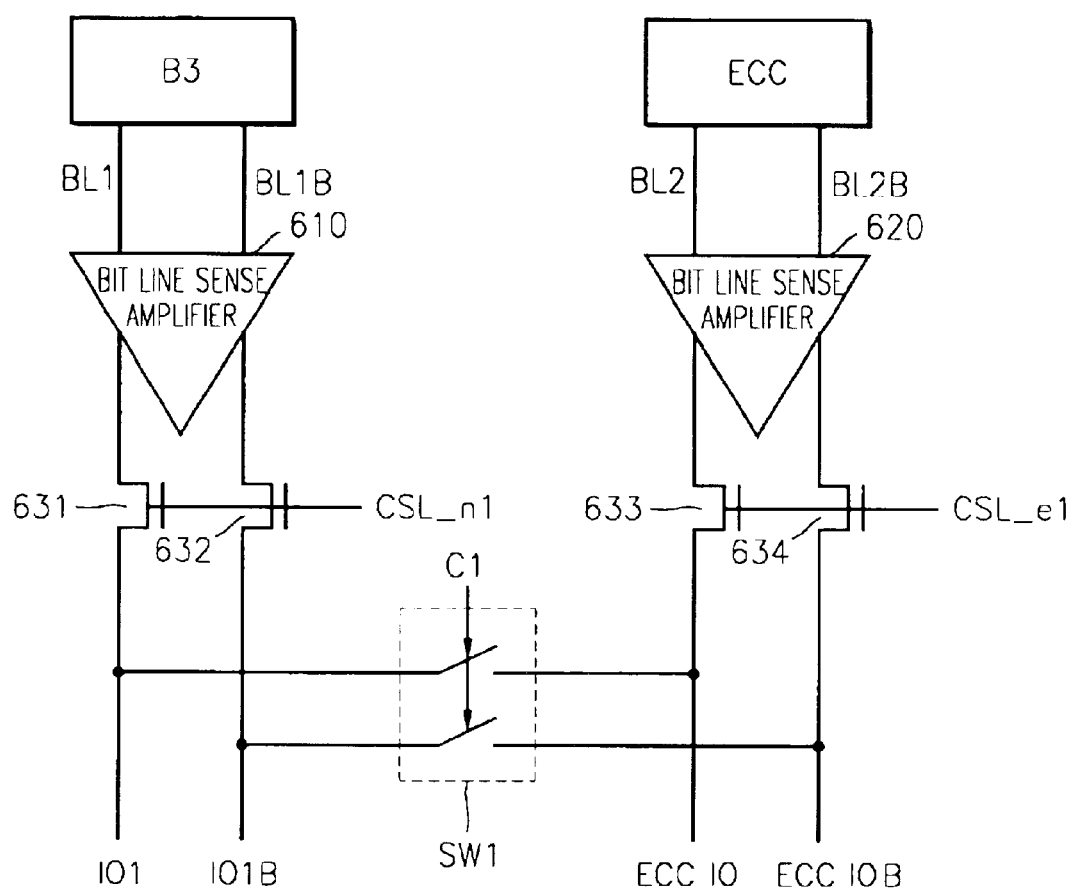
FIG. 6 is a diagram illustrating substitution of memory cells of the semiconductor memory device in FIG. 5 according to an embodiment of the present invention.

As an alternative to the embodiment described in connection with FIG. 4, where the normal memory cells are replaced by the ECC memory cells via the input/out lines, the normal memory cells are replaced by the ECC memory cells via a column select line (CSL) in the embodiment described in connection with FIG. 5. As shown in FIG. 6, normal memory cells responsive to a CSL can be replaced by the ECC memory cells.

Referring to FIG. 6, data stored in the normal memory cells of, for example, the normal cell block B3 is detected and amplified by a bit line sense amplifier 610 through a pair of bit lines BL1 and BL1B. The bit line sense amplifier 610 is connected to a pair of normal input/output lines IO and IO1B through transmission gates 631 and 632. The transmission gates 631 and 632 are turned on or off by a CSL signal CSL_n1. Data stored in the ECC memory cells of the ECC cell block ECC are detected and amplified by a bit line sense amplifier 620 through a pair of bit lines BL2 and BL2B. The bit line sense amplifier 620 is connected to a pair of ECC input/output lines ECC IO and ECC IOB through transmission gates 633 and 634. The transmission gates 633 and 634 are turned on or off by an ECC CSL signal CSL_e1.

When normal memory cells connected to the pair of bit lines BL1 and BL1B, which are responsive to the CSL signal CSL_n1, are defective, the CSL signal CSL_n1 is disabled and the ECC CSL signal CSL_e1 is enabled. The ECC switch SW1 is turned on to connect the pair of normal input/output lines IO1 and IO1B to the pair of the ECC input/output lines ECC IO and ECC IOB. Accordingly, the connection between the defective memory cells and the normal input/output lines IO1 and IO1B is cut off, and data which would be stored in the normal memory cells connected to the pair of normal input/output lines IO1 and IO1B is stored instead in the ECC memory cell through the pair of normal input/output lines IO1 and IO1B and the pair of ECC input/output lines ECC IO and ECC IOB.

It is to be understood that, while one memory bank has be illustrated in FIGS. 3 through 5 for explaining the concept of the embodiments of present invention, the number of the memory banks is can be varied. Similarly, the numbers of normal cell blocks, redundancy cell blocks, and ECC cell blocks within one memory bank can also vary.

As described above, unused ECC cells may be used as redundancy cells, and accordingly, redundancy efficiency may be improved, resulting in an increased ability to repair defective memory cells and increased yield of semiconductor chips.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device, comprising:
   a plurality of normal cell blocks including a plurality of normal memory cells for storing data;
   a plurality of redundancy cell blocks including a plurality of redundancy memory cells for substituting for defective normal memory cells; and
   at least one ECC cell block including a plurality of ECC memory cells for substituting for the defective normal memory cells in response to a mode signal.

2. The semiconductor memory device of claim 1, wherein the plurality of ECC memory cells are used for substituting for the defective normal memory cells after each of the plurality of redundancy memory cells has been used for substituting for the defective normal memory cells.

3. The semiconductor memory device of claim 1, wherein the mode signal is generated when a bonding option occurs.

4. The semiconductor memory device of claim 1, wherein the mode signal is generated when a predetermined fuse is cut.

5. The semiconductor memory device of claim 1, further comprising:
   a plurality of normal data lines for at least one of inputting and outputting the data to and from the plurality of normal memory cells;
   a plurality of ECC data lines for at least one of inputting and outputting the data to and from the plurality of ECC memory cells; and
   at least one repair circuit for severing a connection between at least one normal data line of the plurality of normal data lines and at least one normal cell block of the plurality of normal cell blocks in response to the mode signal, and for connecting the at least one normal data line to at least one ECC data line of the plurality of ECC data lines.

6. The semiconductor memory device of claim 5, wherein the at least one repair circuit includes:
   at least one normal switching unit for controlling the connection between the at least one normal data line and the at least one normal cell block; and
   at least one ECC switching unit for controlling the connection between the at least one normal data line and the at least one ECC data line.

7. The semiconductor memory device of claim 6, wherein the at least one normal switching unit and the at least one ECC switching unit are respectively turned on or off in response to control signals.

8. The semiconductor memory device of claim 7, wherein the control signals are generated when a predetermined fuse is cut or when a bonding option occurs.

9. The semiconductor memory device of claim 1, further comprising:
a plurality of normal bit lines connected to the plurality of normal memory cells;
a plurality of normal data lines for at least one of inputting and outputting the data to and from the plurality of normal memory cells;
a plurality of normal transmission gates for connecting the plurality of normal bit lines to the plurality of normal data lines in response to a first column select line signal;
a plurality of ECC bit lines connected to the plurality of ECC memory cells;
a plurality of ECC data lines for at least one of inputting and outputting the data to and from the plurality of ECC memory cells;
a plurality of ECC transmission gates for connecting the plurality of ECC bit lines to the plurality of ECC data lines in response to a second column select line signal; and
at least one repair circuit for enabling the second column select line signal in response to the mode signal.

10. The semiconductor memory device of claim 9, wherein the at least one repair circuit includes a plurality of switching units for connecting the plurality the normal data lines to the plurality of ECC data lines in response to the mode signal.

11. The semiconductor memory device of claim 10, wherein the plurality of switching units are turned on or off in response to control signals.

12. The semiconductor memory device of claim 11, wherein the control signals are generated when a predetermined fuse is cut or when a bonding option occurs.

13. The semiconductor memory device of claim 1, wherein the mode signal represents a bit configuration indicating a number of data bits one of input to and output from the semiconductor memory device.

14. A semiconductor memory device, comprising: a plurality of normal cell blocks including a plurality of normal memory cells for storing data;
at least one ECC cell block including a first plurality of ECC memory cells for storing ECC data;
at least one other ECC cell block including a second plurality of ECC memory cells, wherein the second plurality of ECC memory cells is not used for storing ECC data; and
at least one repair circuit for controlling the at least one ECC cell block and the first plurality of ECC memory cells, whereby the first plurality of ECC memory cells are used for substituting for defective normal memory cells in response to a mode signal, and are not used for storing ECC data.

15. The semiconductor memory device of claim 14, wherein the mode signal is generated in response when a bonding option occurs.

16. The semiconductor memory device of claim 14, wherein the mode signal is generated in response twhen a predetermined fuse is cut.

17. The semiconductor memory device of claim 14, further comprising:
a plurality of normal data lines for at least one of inputting and outputting the data to and from the plurality of normal memory cells; and
a plurality of ECC data lines for at least one of inputting and outputting the data to and from the first and the second plurality of ECC memory cells, wherein the at least one repair circuit severs a connection between at least one normal data line of the plurality of normal data lines and at least one normal cell block of the plurality of normal cell blocks in response to the mode signal, and connects the at least one normal data line to at least one ECC data line of the plurality of ECC data lines.

18. The semiconductor memory device of claim 17, wherein the at least one repair circuit includes:
at least one normal switching unit for controlling a connection between the at least one normal data line and the at least one normal cell block; and
at least one ECC switching unit for controlling a connection between the at least one normal data line and the at least one ECC data line.

19. The semiconductor memory device of claim 14, further comprising:
a plurality of normal bit lines connected to the plurality of normal memory cells;
a plurality of normal data lines for at least one of inputting and outputting the data to and from the plurality of normal memory cells;
a plurality of normal gates for connecting the plurality of normal bit lines to the plurality of normal data lines in response to a first column select line signal;
a plurality of ECC bit lines connected to the first and the second plurality of ECC memory cells;
a plurality of ECC data lines for at least one inputting and outputting the data to and from the first and the second plurality of ECC memory cells; and
a plurality of ECC gates for connecting the plurality of ECC bit lines to the plurality of ECC data lines in response to a second column select line signal.

20. The semiconductor memory device of claim 19, wherein the at least one repair circuit includes at least one switching unit for connecting at least one normal data line of the plurality of normal data lines to at least one ECC data line of the plurality of ECC data lines in response to the mode signal.

21. A semiconductor memory device, comprising:
at least one first level cell block including a plurality of first level memory cells for storing data;
at least one second level cell block including a plurality of second level memory cells for substituting for defective first level memory cells; and
at least one third level cell block including a plurality of third level memory cells for substituting for the defective first level memory cells in response to a mode signal.

22. The semiconductor memory device of claim 21, wherein the plurality of third level memory cells are used for substituting for the defective first level memory cells when the plurality of second level memory cells are not available for substituting for the defective first level memory cells.

23. The semiconductor memory device of claim 21, further comprising:
at least one data line for carrying the data at least one of to and from the plurality of first level memory cells;
at least one other data line for carrying the data at least one of to and from the plurality of third level memory cells; and
at least one repair circuit for severing a connection between the at least one data line and at least one first level memory cell of the plurality of first level memory cells, and for connecting the at least one data line to the at least one other data line.

24. The semiconductor memory device of claim 21, further comprising:
   at least one bit line connected to the plurality of first level memory cells;
   at least one data line for carrying the data at least one of to and from the plurality of first level memory cells;
   at least one transmission gate for connecting the at least one bit line to the at least one data line in response to a first column select line signal;
   at least one other bit line connected to the plurality of third level memory cells;
   at least one other data line for carrying the data at least one of to and from the plurality of third level memory cells;
   at least one other transmission gate for connecting the at least one other bit line to the at least one other data line in response to a second column select line signal; and
   at least one repair circuit for enabling the second column select line signal in response to the mode signal.

* * * * *